United States Patent
Haneda et al.

(10) Patent No.: US 11,863,123 B2
(45) Date of Patent: Jan. 2, 2024

(54) CIRCUIT DEVICE AND OSCILLATOR

(71) Applicant: SEIKO EPSON CORPORATION, Tokyo (JP)

(72) Inventors: Hideo Haneda, Shiojiri (JP); Yuichi Toriumi, Minowa (JP)

(73) Assignee: SEIKO EPSON CORPORATION

( * ) Notice: Subject to any disclaimer, the term of this patent is extended or adjusted under 35 U.S.C. 154(b) by 66 days.

(21) Appl. No.: 17/873,212

(22) Filed: Jul. 26, 2022

(65) Prior Publication Data

US 2023/0035498 A1  Feb. 2, 2023

(30) Foreign Application Priority Data

Jul. 27, 2021 (JP) ................. 2021-122197

(51) Int. Cl.
*H03B 5/04* (2006.01)
*H03B 5/32* (2006.01)

(52) U.S. Cl.
CPC ............. *H03B 5/04* (2013.01); *H03B 5/32* (2013.01)

(58) Field of Classification Search
CPC ........................................................ H03B 5/04
USPC ........................................................ 331/44
See application file for complete search history.

(56) References Cited

U.S. PATENT DOCUMENTS

| | | | | |
|---|---|---|---|---|
| 5,869,758 | A * | 2/1999 | Huiberts | G01F 1/6842 73/204.11 |
| 6,430,130 | B1 * | 8/2002 | Furukawa | G11B 7/13925 |
| 2001/0048349 | A1 * | 12/2001 | Matsumoto | H03L 7/099 331/25 |
| 2008/0297268 | A1 * | 12/2008 | Matsui | H03L 1/025 331/176 |
| 2013/0108904 | A1 * | 5/2013 | Okabayashi | H01M 10/486 374/45 |
| 2019/0212145 | A1 * | 7/2019 | Kiya | G01C 19/5621 |
| 2019/0369560 | A1 * | 12/2019 | Yamazaki | G04C 3/08 |
| 2020/0018794 | A1 * | 1/2020 | Uehara | G01R 31/31727 |
| 2020/0021243 | A1 * | 1/2020 | Uehara | H03B 5/368 |

FOREIGN PATENT DOCUMENTS

JP  2010-056986 A  3/2010

* cited by examiner

*Primary Examiner* — Joseph Chang
(74) *Attorney, Agent, or Firm* — Harness, Dickey & Pierce, P.L.C.

(57) ABSTRACT

A circuit device includes an oscillation circuit that generates an oscillation signal using a resonator, a temperature detection circuit that outputs temperature detection data, a temperature compensation circuit, and a temperature detection rate control circuit. The temperature compensation circuit performs temperature compensation on an oscillation frequency of the oscillation signal based on the temperature detection data. The temperature detection rate control circuit controls a temperature detection rate at which the temperature detection circuit executes temperature detection. At this time, the temperature detection rate control circuit controls the temperature detection rate based on a variation in the temperature detection data.

12 Claims, 12 Drawing Sheets

FIG. 5
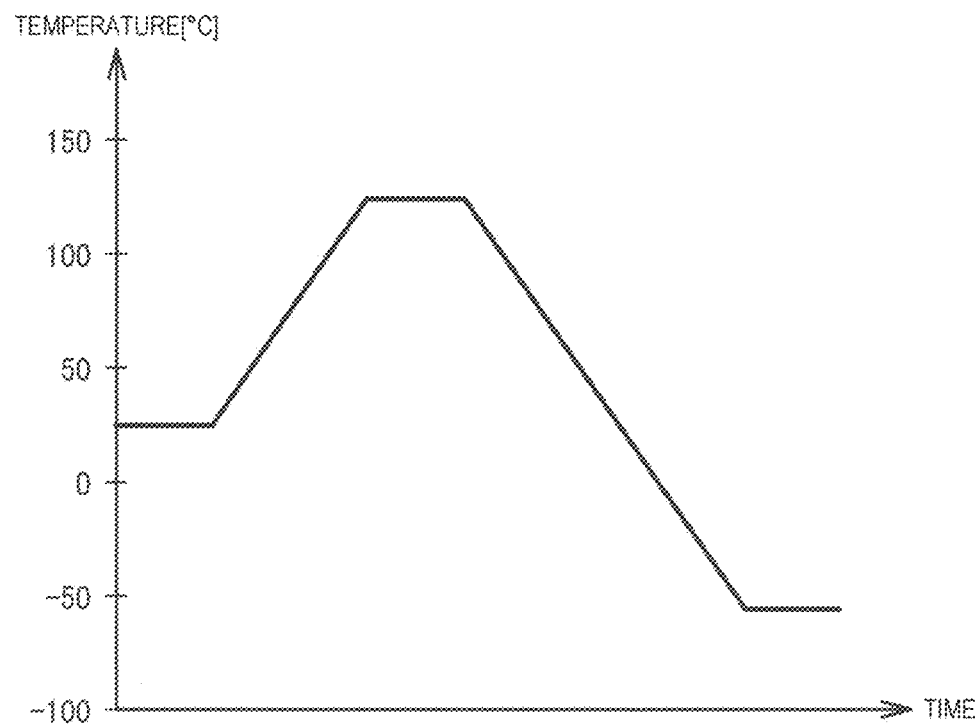
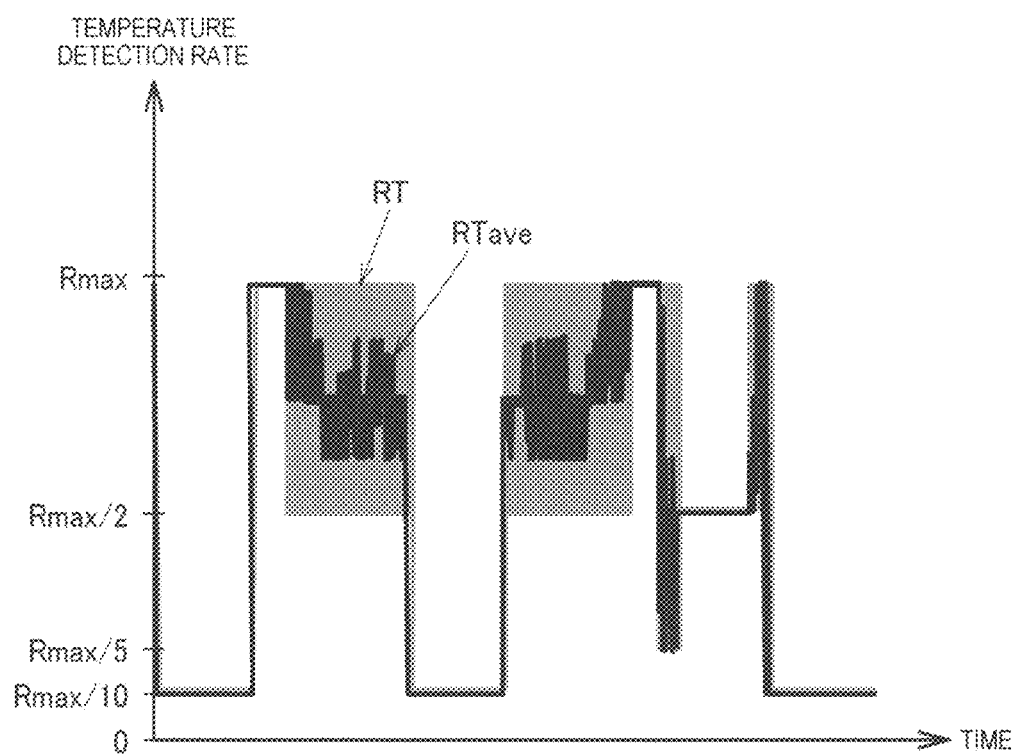

CIRCUIT DEVICE AND OSCILLATOR

The present application is based on, and claims priority from JP Application Serial Number 2021-122197, filed Jul. 27, 2021, the disclosure of which is hereby incorporated by reference herein in its entirety.

BACKGROUND

1. Technical Field

The present disclosure relates to a circuit device, an oscillator, and the like.

2. Related Art

JP-A-2010-056986 discloses a quartz crystal oscillator including: an inverter configured to oscillate a quartz crystal resonator; a variable capacitance diode configured to adjust an oscillation frequency; a temperature sensor; and a control unit configured to execute, based on an output of the temperature sensor, temperature correction control of the oscillation frequency by controlling a capacitance value of the variable capacitance diode. The control unit causes a frequency of temperature correction control at the beginning of start-up of a power supply of the quartz crystal oscillator or surroundings to be higher than a frequency of temperature correction control at a normal time. Accordingly, the quartz crystal oscillator in JP-A-2010-056986 achieves temperature correction that is stable or stabilizes in a shorter time with respect to a sudden change in ambient temperature.

In JP-A-2010-056986, the quartz crystal oscillator increases a frequency of the temperature correction control at a specific timing which is the beginning of the start-up of the power supply of the quartz crystal oscillator or the surroundings. However, it may not be possible for the temperature correction to follow the temperature variation and it may not be possible to maintain a highly accurate oscillation frequency since the frequency of the temperature correction control remains normal when the temperature variates at a time that is not the specific timing assumed in advance.

SUMMARY

An aspect of the present disclosure relates to a circuit device including: an oscillation circuit configured to generate an oscillation signal using a resonator; a temperature detection circuit configured to output temperature detection data; a temperature compensation circuit configured to perform temperature compensation on an oscillation frequency of the oscillation signal based on the temperature detection data; and a temperature detection rate control circuit configured to control a temperature detection rate at which the temperature detection circuit executes temperature detection. The temperature detection rate control circuit controls the temperature detection rate based on a variation in the temperature detection data.

Another aspect of the present disclosure relates to an oscillator including a resonator and a circuit device. The circuit device includes: an oscillation circuit configured to generate an oscillation signal using a resonator; a temperature detection circuit configured to output temperature detection data; a temperature compensation circuit configured to perform temperature compensation on an oscillation frequency of the oscillation signal based on the temperature detection data; and a temperature detection rate control circuit configured to control a temperature detection rate at which the temperature detection circuit executes temperature detection. The temperature detection rate control circuit controls the temperature detection rate based on a variation in the temperature detection data.

BRIEF DESCRIPTION OF THE DRAWINGS

FIG. 5 is a waveform example showing a change in a temperature detection rate when an environmental temperature of the circuit device changes.

DESCRIPTION OF EXEMPLARY EMBODIMENTS

Thereafter, a preferred embodiment of the present disclosure will be described in detail. The present embodiment to be described below does not unduly limit contents described in the claims, and all configurations described in the present embodiment are not necessarily essential constituent elements.

1. Circuit Device and Oscillator

Figure 1:
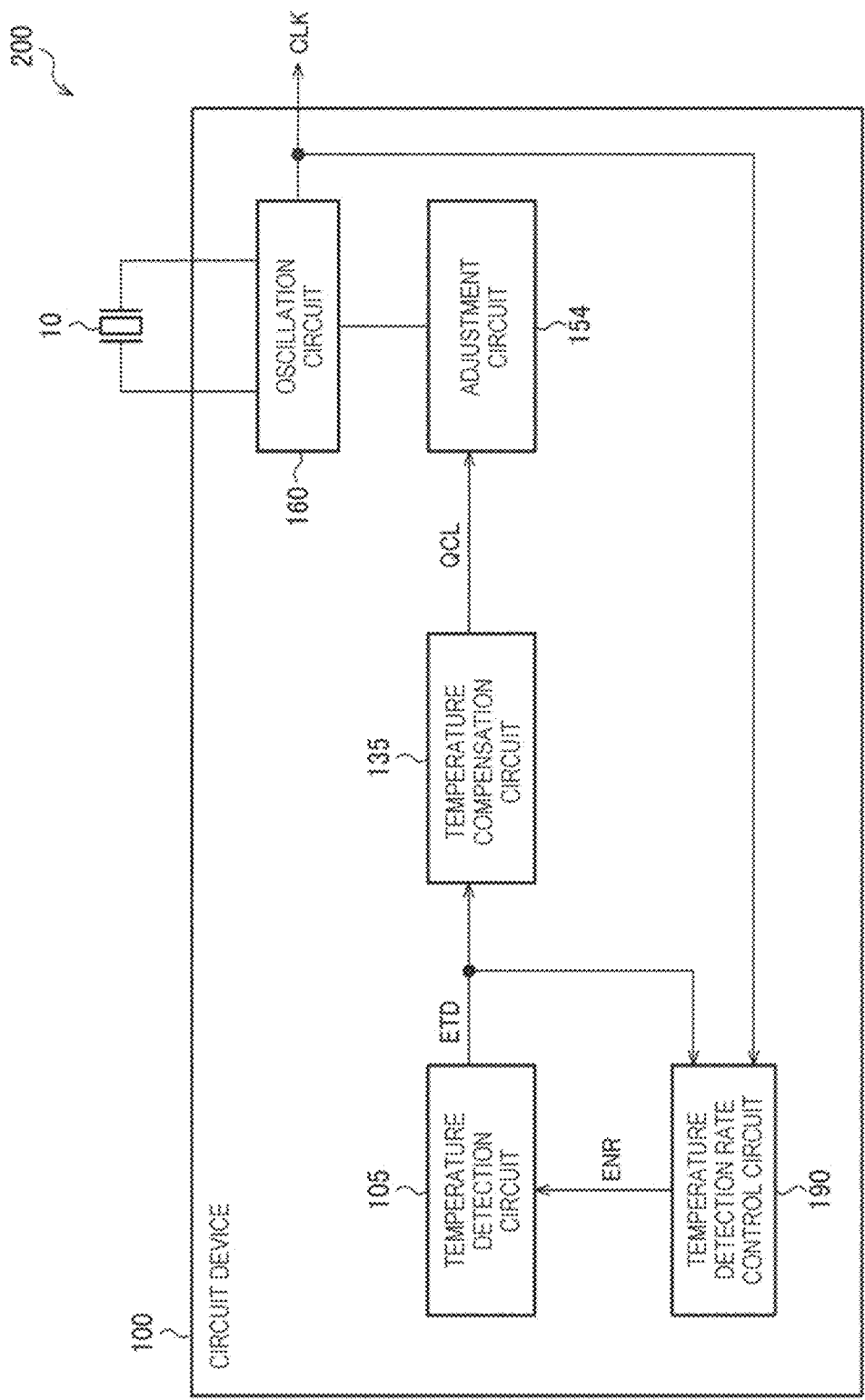
FIG. 1 is a configuration example of an oscillator and a circuit device.

FIG. 1 is a configuration example of an oscillator 200 and a circuit device 100 according to the present embodiment. The oscillator 200 includes a resonator 10 and the circuit device 100.

The resonator 10 is an element that generates mechanical oscillation according to an electric signal. The resonator 10 can be implemented by a resonator element such as a quartz crystal resonator element. For example, the resonator 10 is a tuning fork type quartz crystal resonator element. Alternatively, the resonator 10 can be implemented by a quartz crystal resonator element or the like that has a cut angle of AT cut, SC cut, or the like and that performs thickness-shear vibration. The resonator 10 according to the present embodiment can be implemented by various resonator elements such as a resonator element other than a tuning fork type or thickness-shear vibration type resonator element, or a piezoelectric resonator element made of a material other than quartz crystal. For example, the resonator 10 may be a SAW resonator, or a MEMS resonator serving as a silicon resonator formed using a silicon substrate. SAW is an abbreviation for surface acoustic wave, and MEMS is an abbreviation for micro electro mechanical systems.

The circuit device 100 is electrically coupled to the resonator 10 and oscillates the resonator 10 by driving the resonator 10. Coupling in the present embodiment is electrical coupling. The electrical coupling refers to coupling in which an electric signal can be transmitted, and refers to coupling in which information can be transmitted by the electric signal. The electrical coupling may be coupling performed via a passive element, an active element, or the like. In addition, the circuit device 100 performs a temperature compensation process of causing an oscillation frequency of the oscillator 200 to be constant regardless of a temperature. The circuit device 100 is an integrated circuit device referred to as IC. The circuit device 100 is an IC manufactured by a semiconductor process, and is a semiconductor chip in which a circuit element is formed at a semiconductor substrate.

The circuit device 100 includes a temperature detection circuit 105, a temperature compensation circuit 135, an adjustment circuit 154, an oscillation circuit 160, and a temperature detection rate control circuit 190. The oscillator and the circuit device are not limited to the configuration in FIG. 1, and various modifications such as omitting a part of constituent elements of the oscillator and the circuit device or adding other constituent elements are possible.

The temperature detection circuit 105 measures an environmental temperature of the resonator 10 and outputs a result of the measurement as temperature detection data ETD. The temperature detection data ETD is data that monotonically increases or monotonically decreases with respect to the temperature in an operation temperature range of the circuit device 100. The temperature detection circuit 105 includes a counter and a ring oscillator whose oscillation frequency has temperature dependency. The counter counts an oscillation signal of the ring oscillator in an enable period defined according to a clock signal CLK output from the oscillation circuit 160, and outputs a count value as the temperature detection data ETD. Alternatively, the temperature detection circuit 105 may include an analog temperature sensor that outputs a temperature detection voltage using temperature dependence of a forward voltage of a PN junction, and an A/D converter that performs A/D conversion on the temperature detection voltage and that outputs the temperature detection data ETD. As described later with reference to FIG. 6, the temperature detection circuit 105 may further include a calculation circuit that outputs the temperature detection data ETD by adjusting temperature sensitivity for the output data of the counter or the output data of the A/D converter.

The temperature compensation circuit 135 outputs, based on the temperature detection data ETD, adjustment data QCL for temperature compensation on an oscillation frequency of the oscillation circuit 160. The adjustment data QCL is data for canceling or reducing temperature properties of the oscillation frequency. The temperature compensation circuit 135 obtains the adjustment data QCL based on the temperature detection data ETD using a look-up table. Alternatively, the temperature compensation circuit 135 may obtain the adjustment data QCL based on the temperature detection data ETD by executing calculation using a polynomial that approximates the temperature properties of the oscillation frequency.

The adjustment circuit 154 is coupled to the oscillation circuit 160, and adjusts the oscillation frequency of the oscillation circuit 160 to an oscillation frequency corresponding to the adjustment data QCL. The oscillation frequency is controlled to be constant regardless of a temperature by adjusting the oscillation frequency using the adjustment data QCL for canceling or reducing the temperature properties of the oscillation frequency. The adjustment circuit 154 is a capacitance array circuit coupled to one end or the other end of the resonator 10. Alternatively, the adjustment circuit 154 may include a D/A converter that performs D/A conversion on the adjustment data QCL, and a variable capacitor coupled to one end or the other end of the resonator 10. A capacitance value of the variable capacitor is controlled according to an output voltage of the D/A converter.

The oscillation circuit 160 generates an oscillation signal using the resonator 10. Specifically, the oscillation circuit 160 oscillates the resonator 10 by driving the resonator 10, and generates an oscillation signal by the oscillation. An example of the oscillation circuit 160 is a colpitts type oscillation circuit described later, and the oscillation circuit 160 is not limited thereto. Alternatively, various types of oscillation circuits may be used as long as the oscillation frequency can be adjusted by the adjustment circuit 154. The clock signal CLK is output based on the oscillation signal. For example, the oscillation circuit 160 may output the oscillation signal as the clock signal CLK. Alternatively, the circuit device 100 may include an output circuit, and the output circuit may output the clock signal CLK by buffering or dividing the oscillation signal.

The temperature detection rate control circuit 190 calculates a variation in the temperature detection data ETD, and adaptively controls the temperature detection rate according to the variation. The temperature detection rate is a rate at which the temperature detection circuit 105 detects a temperature, that is, a rate at which the temperature detection circuit 105 updates the temperature detection data ETD. The temperature detection rate control circuit 190 enables an enable signal ENR at the controlled temperature detection rate, and the temperature detection circuit 105 detects the temperature when the enable signal ENR is enabled. The temperature detection rate can be set to n stages of a first rate to a n-th rate when n is an integer of two or more. The k-th rate is a rate higher than the (k−1)-th rate when k is an integer of two or more and n or less. The temperature detection rate control circuit 190 sets the temperature detection rate as the n-th rate when the variation in the temperature detection data ETD is a first threshold value or more, and decreases the temperature detection rate in a stepwise manner when the variation in the temperature detection data ETD is a second threshold value or less. The second threshold value is smaller than the first threshold value. The temperature detection rate and the enable period of the enable signal ENR are defined based on a frequency or a cycle of the clock signal CLK.

In the present embodiment described above, the circuit device 100 includes the oscillation circuit 160 that generates an oscillation signal using the resonator 10, the temperature detection circuit 105 that outputs the temperature detection data ETD, the temperature compensation circuit 135, and the temperature detection rate control circuit 190. The temperature compensation circuit 135 performs temperature compensation on an oscillation frequency of the oscillation signal based on the temperature detection data ETD. The temperature detection rate control circuit 190 controls a temperature detection rate at which the temperature detection circuit 105 executes temperature detection. At this time, the temperature detection rate control circuit 190 controls the temperature detection rate based on a variation in the temperature detection data ETD.

According to the present embodiment, when an environmental temperature changes, the temperature detection rate is controlled based on the variation in the temperature detection data ETD. Accordingly, it is possible to cause the temperature compensation to follow the temperature variation caused by various factors and at various timings, and a highly accurate oscillation frequency is maintained. In addition, since the temperature detection rate can be decreased when there is no or small temperature variation, both high accuracy of the oscillation frequency and low power consumption of the circuit can be achieved.

2. Temperature Detection Rate Control Circuit

Figure 2:
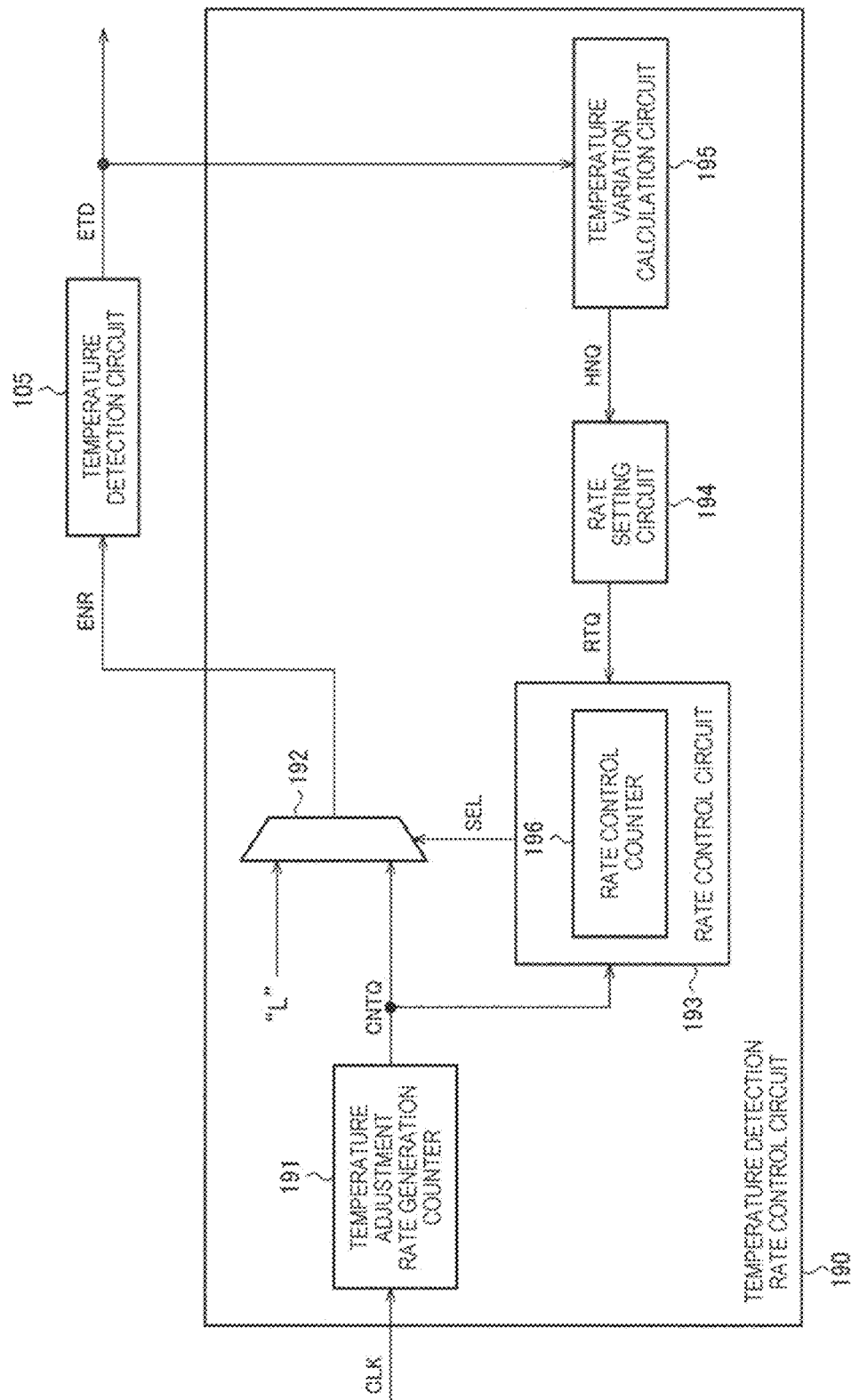
FIG. 2 is a detailed configuration example of a temperature detection rate control circuit.
Figure 3:
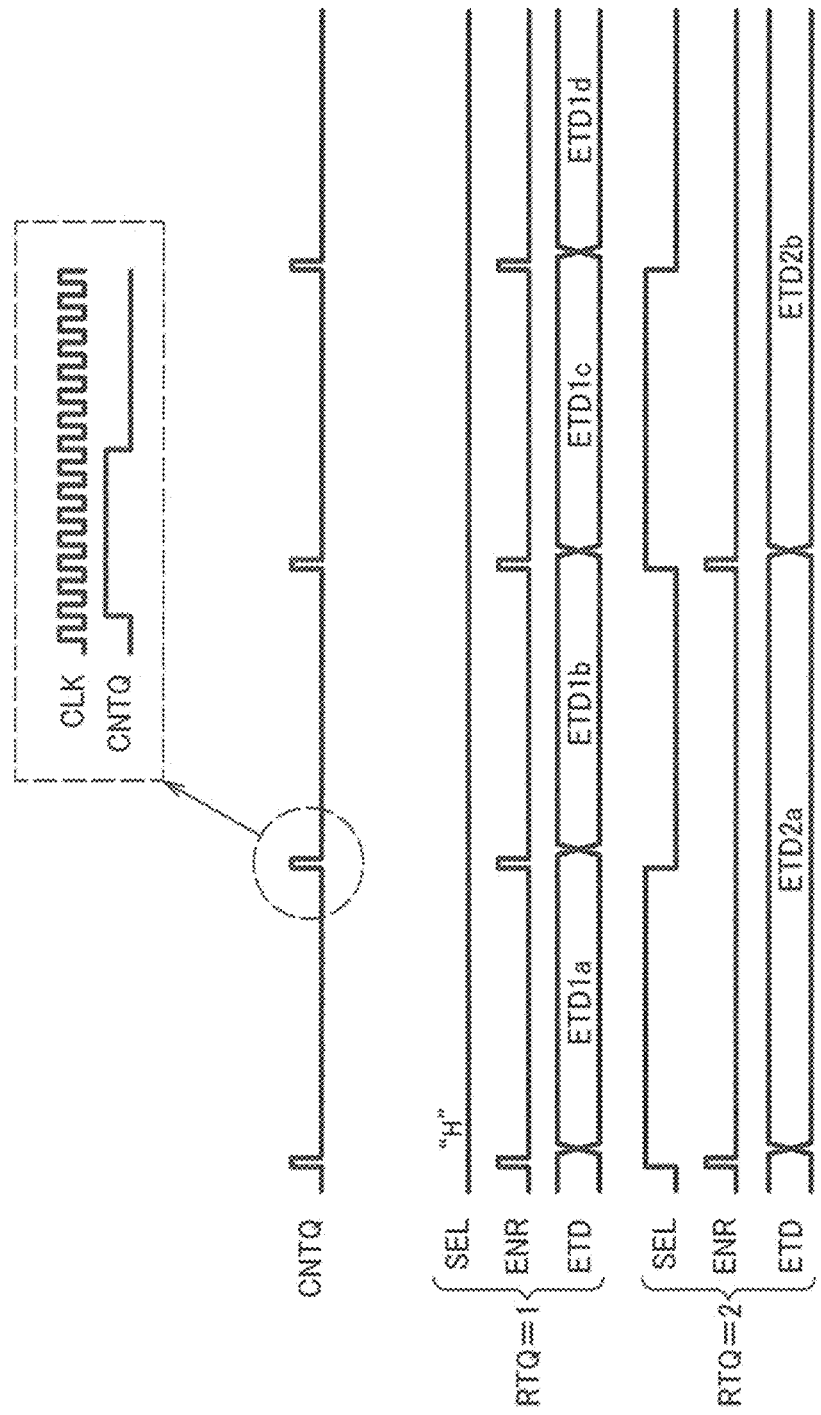
FIG. 3 is a timing chart showing an operation of the temperature detection rate control circuit.

FIG. 2 is a detailed configuration example of the temperature detection rate control circuit 190. FIG. 3 is a timing chart showing an operation of the temperature detection rate control circuit 190. As shown in FIG. 2, the temperature detection rate control circuit 190 includes a temperature adjustment rate generation counter 191, a selector 192, a rate control circuit 193, a rate setting circuit 194, and a temperature variation calculation circuit 195.

The temperature adjustment rate generation counter 191 divides the clock signal CLK to output a rate control clock signal CNTQ having the same frequency as a maximum rate of a temperature adjustment rate. As shown in FIG. 3, the rate control clock signal CNTQ has the same pulse width as a pulse width of the enable signal ENR. Here, it is assumed that a high level of the enable signal ENR indicates enable, and the pulse width of the enable signal ENR is a high width. FIG. 3 shows an example in which the pulse width is set to seven cycles of the clock signal CLK.

The temperature variation calculation circuit 195 calculates a variation HNQ in the temperature detection data ETD based on the temperature detection data ETD. As shown in FIG. 3, the temperature detection circuit 105 detects a temperature when a pulse of the enable signal ENR is input, and outputs the temperature detection data ETD which is a result of the detection. The temperature variation calculation circuit 195 calculates, as the variation HNQ in the temperature detection data ETD, a difference between the temperature detection data ETD and the previously output temperature detection data ETD. For example, in a waveform diagram in which RTQ=1, when the temperature detection circuit 105 outputs temperature detection data ETD1$b$ following temperature detection data ETD1$a$, the temperature variation calculation circuit 195 outputs the variation HNQ=ETD1$b$–ETD1$a$ in the temperature detection data ETD.

The rate setting circuit 194 adaptively sets a rate setting value RTQ according to the variation HNQ in the temperature detection data ETD. Thereafter, it is assumed that the rate setting circuit 194 selects a rate setting value from RTQ=1, 2, 5, and 10. Options of the rate setting value are not limited to the above, and the number of the options is not limited to four and may be two or more.

The rate control circuit 193 outputs a rate control signal SEL based on the rate control clock signal CNTQ and the rate setting value RTQ. The selector 192 outputs the rate control clock signal CNTQ as the enable signal ENR when the rate control signal SEL is at a high level, and outputs the enable signal ENR at a low level when the rate control signal SEL is at a low level. When a pulse rate of the rate control clock signal CNTQ is Rmax, the rate control circuit 193 outputs the rate control signal SEL such that a pulse rate of the enable signal ENR becomes Rmax/RTQ.

FIG. 3 is a waveform example in which RTQ=1, and a waveform example in which RTQ=2. When RTQ=1, the rate control circuit 193 fixes the rate control signal SEL to a high level, and the selector 192 outputs the rate control clock signal CNTQ as the enable signal ENR. The temperature detection circuit 105 outputs the temperature detection data ETD=ETD1$a$, ETD1$b$, ETD1$c$, ETD1$d$, . . . at a temperature detection rate Rmax. When RTQ=2, the rate control circuit 193 outputs the rate control signal SEL having a frequency Rmax/RTQ=Rmax/2, and the selector 192 outputs a pulse of the rate control clock signal CNTQ once as the pulse of the enable signal ENR when RTQ=2. The temperature detection circuit 105 outputs the temperature detection data ETD=ETD2$a$, ETD2$b$, . . . at a temperature detection rate Rmax/2. The same applies to the cases of RTQ=5 and 10, and the temperature detection rates are Rmax/5 and Rmax/10.

Figure 4:
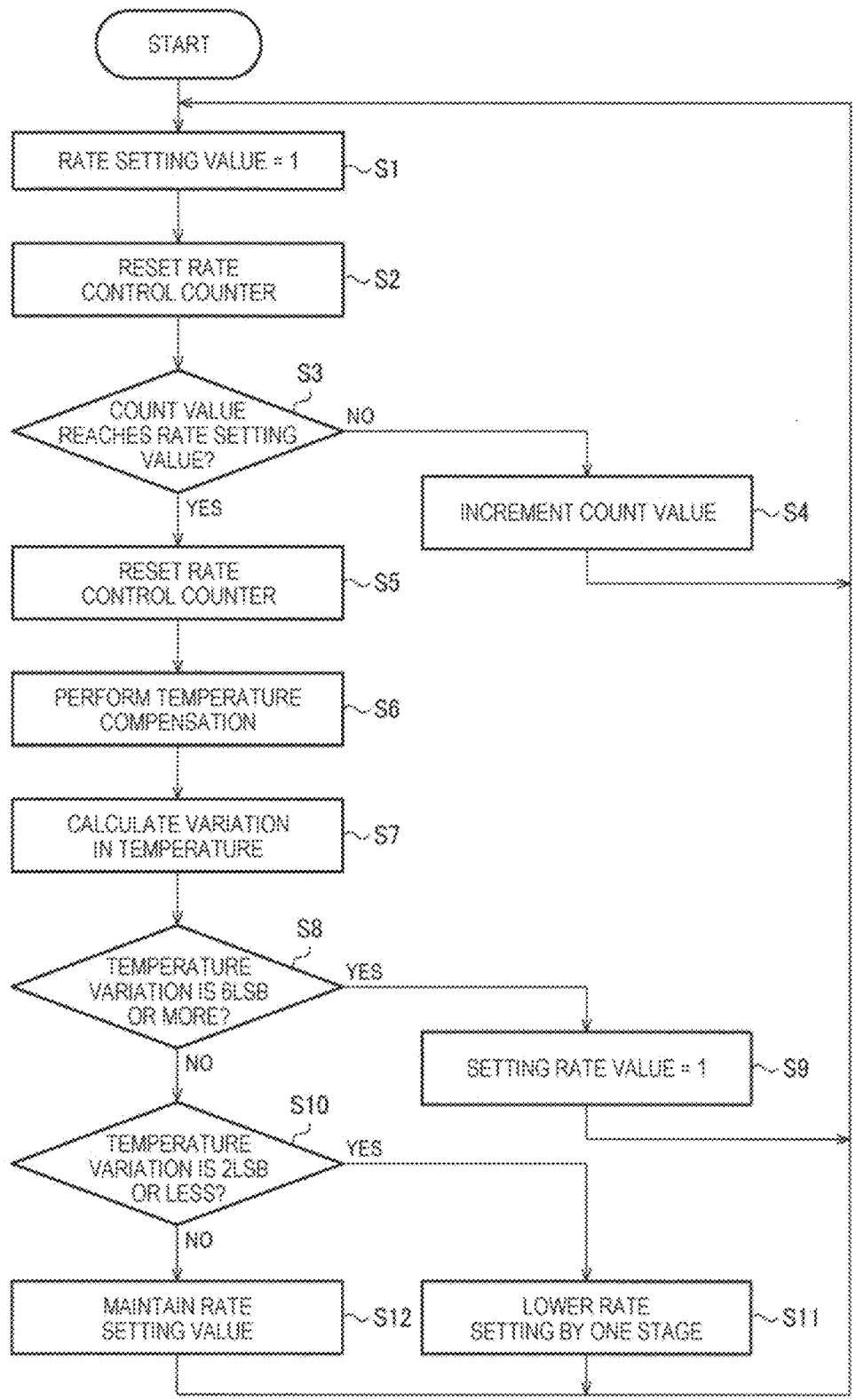
FIG. 4 is a flowchart of a process executed by the temperature detection rate control circuit.

FIG. 4 is a flowchart of a process executed by the temperature detection rate control circuit 190. In step S1, the rate control circuit 193 sets the rate setting value to RTQ=1. That is, an initial value of the temperature detection rate is a maximum rate Rmax.

As shown in FIG. 2, the rate control circuit 193 includes a rate control counter 196 that counts the number of pulses of the rate control clock signal CNTQ. In step S2, the rate control counter 196 resets a count value. Here, it is assumed that the rate control counter 196 counts up to 1, 2, 3, . . . with 1 as an initial value.

In step S3, the rate control circuit 193 determines whether the count value reaches the rate setting value RTQ. When the count value is smaller than the rate setting value RTQ, in step S4, the rate control counter 196 increments the count value when the pulse of the rate control clock signal CNTQ is input. Thereafter, step S3 is executed. When the count value is the rate setting value RTQ or more, in step S5, the rate control counter 196 resets the count value.

In step S6, the temperature compensation is performed. That is, the temperature detection rate control circuit 190 outputs the pulse of the enable signal ENR, the temperature detection circuit 105 detects a temperature, and the temperature compensation circuit 135 outputs the adjustment data QCL based on the temperature detection data ETD. By executing steps S3 to S6 described above, a temperature is detected at a temperature detection rate Rmax/RTQ, and the temperature compensation is performed.

In step S7, the temperature variation calculation circuit 195 calculates a variation in the temperature detection data ETD. That is, the temperature variation calculation circuit 195 calculates, as the variation in the temperature detection data ETD, a difference between the temperature detection data ETD detected in step S6 and the temperature detection data ETD detected when step S6 is previously performed.

In step S8, the rate setting circuit 194 determines whether the variation in the temperature detection data ETD is the first threshold value or more. For example, the first threshold value is 6 LSB. When the variation is 6 LSB or more, in step S9, the rate setting circuit 194 sets the rate setting value to RTQ=1. That is, the temperature detection rate is set to the maximum rate Rmax. Thereafter, step S3 is executed.

In step S8, when the variation is less than 6 LSB, in step S10, the rate setting circuit 194 determines whether the variation in the temperature detection data ETD is the second threshold value or less. For example, the second threshold value is 2 LSB. When the variation is 2 LSB or less, in step S11, the rate setting circuit 194 lowers the rate setting by one stage. That is, when the rate setting values are RTQ=1, 2, and 5, the rate setting circuit 194 changes the rate setting values to RTQ=2, 5, and 10, respectively. Accordingly, when the temperature detection rates are Rmax, Rmax/2, and Rmax/5, the temperature detection rates decrease to Rmax/2, Rmax/5, and Rmax/10, respectively. When the rate setting value is RTQ=10, RTQ=10 is maintained.

When the variation is larger than 2 LSB in step S10, in step S12, the rate setting circuit 194 maintains the rate setting value RTQ. Thereafter, step S3 is executed. By executing steps S7 to S12 described above, the temperature adjustment rate is adaptively controlled according to the variation in the temperature detection data ETD.

FIG. 5 is a waveform example showing a change in a temperature detection rate when an environmental temperature of the circuit device 100 changes. An upper part of FIG. 5 is a waveform showing a temporal variation in the temperature, and a lower part is a waveform of a temperature detection rate RT and a waveform of a movement average RTave of the temperature detection rate RT. Here, a waveform when the temperature rises from 25° C. to 125° C., stays at 125° C. for a while, and then falls to −50° C. is shown.

When the temperature starts to rise from 25° C. and the variation in the temperature detection data ETD exceeds the first threshold value, the temperature detection rate control circuit 190 sets the temperature detection rate RT to the maximum rate Rmax. As the temperature detection rate becomes high, an update interval of the temperature detection data ETD becomes short. Therefore, the variation of the temperature detection data ETD, which is the difference from the previous data, becomes small. When the variation in the temperature detection data ETD is the second threshold value or less, the temperature detection rate control circuit 190 decreases the temperature detection rate RT to Rmax/2 by one stage. Since the variation in the temperature detection data ETD becomes large when the temperature detection rate decreases, the temperature detection rate RT becomes the maximum rate Rmax again, and then Rmax and Rmax/2 are repeated. The movement average RTave of the temperature detection rate RT is Rmax and Rmax/2.

Since the variation in the temperature detection data ETD is the second threshold value or less when the temperature reaches 125° C. and a temperature change stops, the temperature detection rate control circuit 190 decreases the temperature detection rate RT step by step to a minimum rate Rmax/10. Thereafter, similarly, the temperature detection rate control circuit 190 adaptively controls the temperature detection rate according to the temperature variation.

In the present embodiment described above, the temperature detection circuit 105 executes an intermittent operation of executing temperature detection in an intermittent temperature detection period. The temperature detection rate control circuit 190 controls the temperature detection rate by controlling a rate of the intermittent operation.

In the example in FIG. 3, the enable period of the enable signal ENR corresponds to the intermittent temperature detection period, and the temperature detection in the enable period corresponds to the intermittent operation. Further, the temperature detection rate control circuit 190 controls a rate in the enable period, which corresponds to controlling the rate of the intermittent operation.

According to the present embodiment, the temperature compensation is intermittently performed by detecting a temperature by the intermittent operation. Accordingly, power consumption of the temperature compensation is reduced. Further, both high accuracy of an oscillation frequency and low power consumption of a circuit can be achieved by adaptively controlling the rate of the intermittent operation according to the variation in the temperature detection data ETD.

In the present embodiment, the temperature detection rate control circuit 190 sets the temperature detection rate to a n-th rate that is the highest in a first rate to the n-th rate when the variation in the temperature detection data ETD is the first threshold value or more. n is an integer of two or more.

In the examples in FIGS. 4 and 5, n=4, and the temperature detection rates Rmax/10, Rmax/5, Rmax/2, and Rmax when the rate setting values RTQ=10, 5, 2, and 1 correspond to a first rate, a second rate, a third rate, and a fourth rate. At this time, Rmax that is the fourth rate is the highest temperature detection rate.

According to the present embodiment, when there is a temperature variation in which the variation in the temperature detection data ETD is the first threshold value or more, that is, when it is determined that a rapid temperature variation occurs, the temperature detection rate is set to the maximum n-th rate. Accordingly, the temperature compensation follows a variation in an oscillation frequency due to the rapid temperature variation, and a highly accurate oscillation signal with a reduced frequency deviation is obtained.

In the present embodiment, the temperature detection rate control circuit 190 decreases the temperature detection rate from the k-th rate to the (k−1)-th rate among the first rate to the n-th rate when the variation in the temperature detection data ETD is the second threshold value or less. The second threshold value is smaller than the first threshold value. k is an integer of two or more and n or less.

According to the present embodiment, when it is determined that a temperature variation occurring between a previous temperature compensation and a current temperature compensation at a current temperature adjustment rate is small, that is, the temperature adjustment rate is too high with respect to the temperature variation, the temperature detection rate decreases by one stage. Accordingly, the temperature adjustment rate can be set to be as low as possible in a range in which the temperature compensation can follow the variation in the oscillation frequency due to the temperature variation.

In the present embodiment, the initial value of the temperature detection rate is the n-th rate.

Since the variation in the temperature detection data ETD is unknown in an initial state, a followability of the temperature compensation can be ensured from a start of temperature adjustment by setting the n-th rate as the initial value. In addition, when the variation in the temperature detection data ETD is small, the temperature adjustment rate adaptively decreases as described above.

In the present embodiment, the temperature detection rate control circuit 190 controls the temperature detection rate based on the difference between the previous temperature detection data ETD and the current temperature detection data ETD.

The difference between the previous temperature detection data ETD and the current temperature detection data ETD indicates the temperature variation occurring between the previous temperature compensation and the current temperature compensation, and relates to the frequency deviation of the oscillation frequency occurring between the previous temperature compensation and the current temperature compensation. By controlling the temperature adjustment rate according to the difference between the previous temperature detection data ETD and the current temperature detection data ETD, the temperature adjustment rate is controlled such that the frequency deviation of the oscillation frequency occurring between the previous temperature compensation and the current temperature compensation is in an appropriate range.

In the present embodiment, the temperature compensation circuit 135 performs the temperature compensation at the temperature detection rate.

For example, in FIG. 4, in step S6, the temperature compensation is performed together with the temperature detection. In addition, FIG. 7 described later shows that the adjustment data QCL is updated when the temperature detection data ETD is updated.

According to the present embodiment, the temperature adjustment rate that is a rate of the temperature compensation can be controlled by the temperature detection rate control circuit 190 controlling the temperature detection rate. Accordingly, since an overall rate of the temperature compensation from a time point when the temperature detection circuit 105 detects a temperature to a time point when the adjustment circuit 154 adjusts the oscillation frequency is controlled, power consumption of an entire circuit relating to the temperature compensation decreases when the temperature detection rate is reduced.

3. Temperature Detection Circuit

Figure 6:
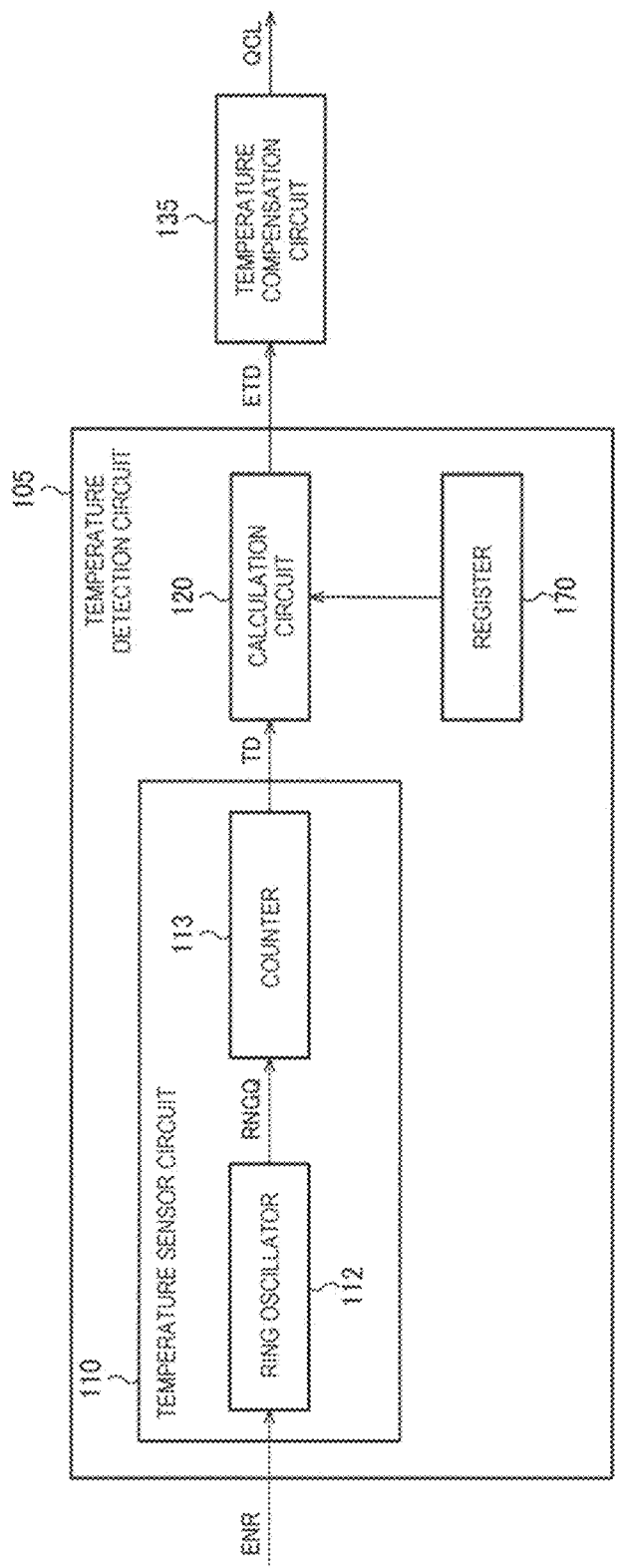
FIG. 6 is a detailed configuration example of a temperature detection circuit.
Figure 7:
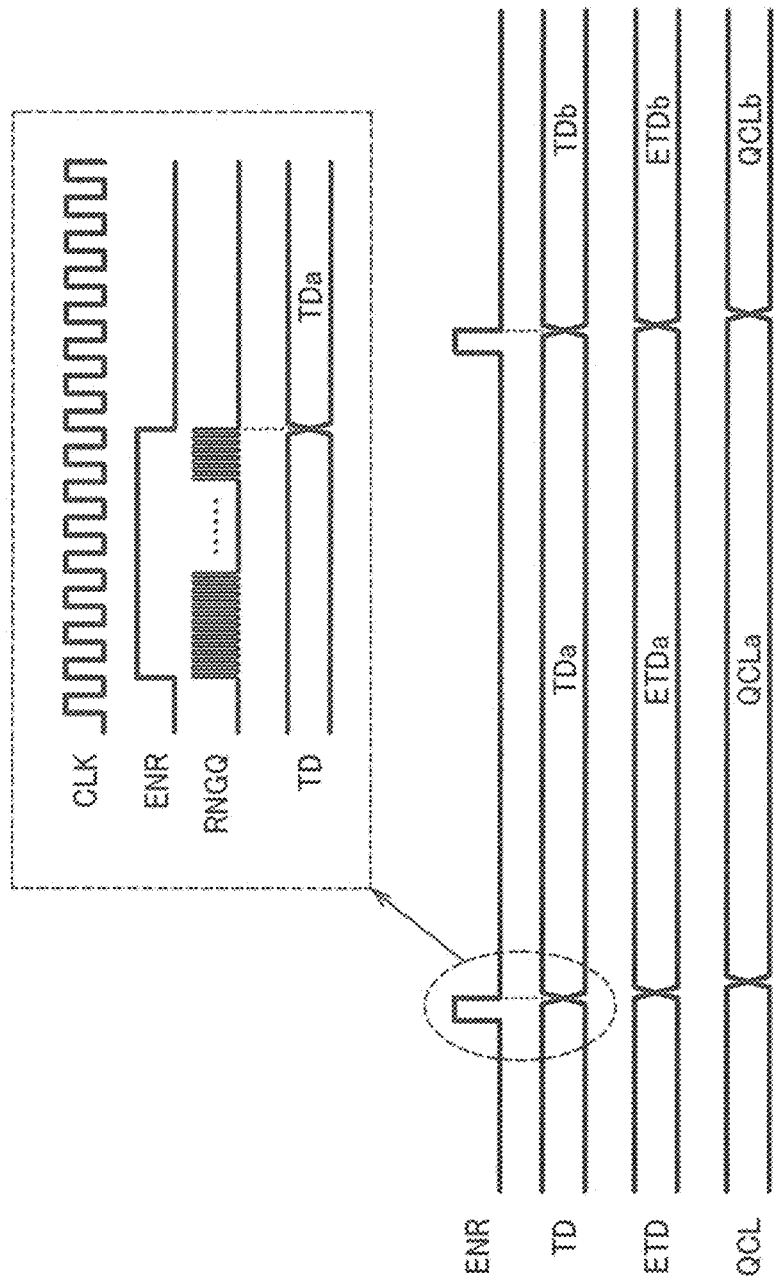
FIG. 7 is a timing chart showing operations of the temperature detection circuit and a temperature compensation circuit.

FIG. 6 is a detailed configuration example of the temperature detection circuit 105. FIG. 7 is a timing chart showing operations of the temperature detection circuit 105 and the temperature compensation circuit 135. As shown in FIG. 6, the temperature detection circuit 105 includes a temperature sensor circuit 110, a calculation circuit 120, and a register 170.

The temperature sensor circuit 110 measures an environmental temperature of the resonator 10 and outputs a result of the measurement as output data TD. The output data TD is data that monotonically increases or monotonically decreases with respect to the temperature in an operation temperature range of the circuit device 100. The temperature sensor circuit 110 includes a ring oscillator 112 and a counter 113.

As shown in FIG. 7, the ring oscillator 112 oscillates during the enable period of the enable signal ENR, and outputs an oscillation signal RNGQ. The ring oscillator 112 includes, for example, a NAND circuit and an even number of inverters coupled in series between an output and a first input of the NAND circuit. The enable signal ENR is input to a second input of the NAND circuit. In this case, a high level corresponds to active, the ring oscillator 112 oscillates when the enable signal ENR is at the high level, and the oscillation of the ring oscillator 112 stops when the enable signal ENR is at a low level. The above configuration is an example, and the configuration of the ring oscillator 112 is not limited to the above.

The counter 113 executes a count operation based on the oscillation signal RNGQ of the ring oscillator 112, and outputs the output data TD based on a count value. Specifically, the counter 113 counts the number of pulses of the oscillation signal RNGQ output in the above enable period, and outputs the count value as the output data TD. In FIG. 7, the counter 113 outputs the output data TD=TDa, TDb, . . . in time series for each pulse of the enable signal ENR. The counter 113 may execute the count operation based on the oscillation signal RNGQ, and may count, for example, the number of pulses of a signal obtained by dividing the oscillation signal RNGQ. In addition, the counter 113 may output the output data TD based on the count value, and may output, for example, the output data TD by smoothing the count value.

The calculation circuit 120 is a logic circuit that converts, into the temperature detection data ETD, the output data TD output by the temperature sensor circuit 110. The temperature detection data ETD is data that monotonically increases or monotonically decreases with respect to the temperature in the same manner as the output data TD, and a slope of the temperature detection data ETD is converted from a slope of the output data TD according to the temperature range. As shown in FIG. 7, the calculation circuit 120 converts the output data TDa into temperature detection data ETDa when the temperature sensor circuit 110 outputs the TDa and converts the output data TDb into temperature detection data ETDb when the temperature sensor circuit 110 outputs the TDb. Details of the conversion will be described below.

The register 170 stores a parameter for the conversion executed by the calculation circuit 120. The parameter stored in the register 170 is input to the calculation circuit 120, and the calculation circuit 120 converts the output data TD into the temperature detection data ETD based on the parameter.

The temperature compensation circuit 135 outputs adjustment data QCLa based on the temperature detection data ETDa when the calculation circuit 120 outputs the ETDa, and outputs adjustment data QCLb based on the temperature detection data ETDb when the calculation circuit 120 outputs the ETDb. In this way, since the temperature compensation is performed at the temperature detection rate, the temperature adjustment rate is the same as the temperature detection rate.

Figure 8:
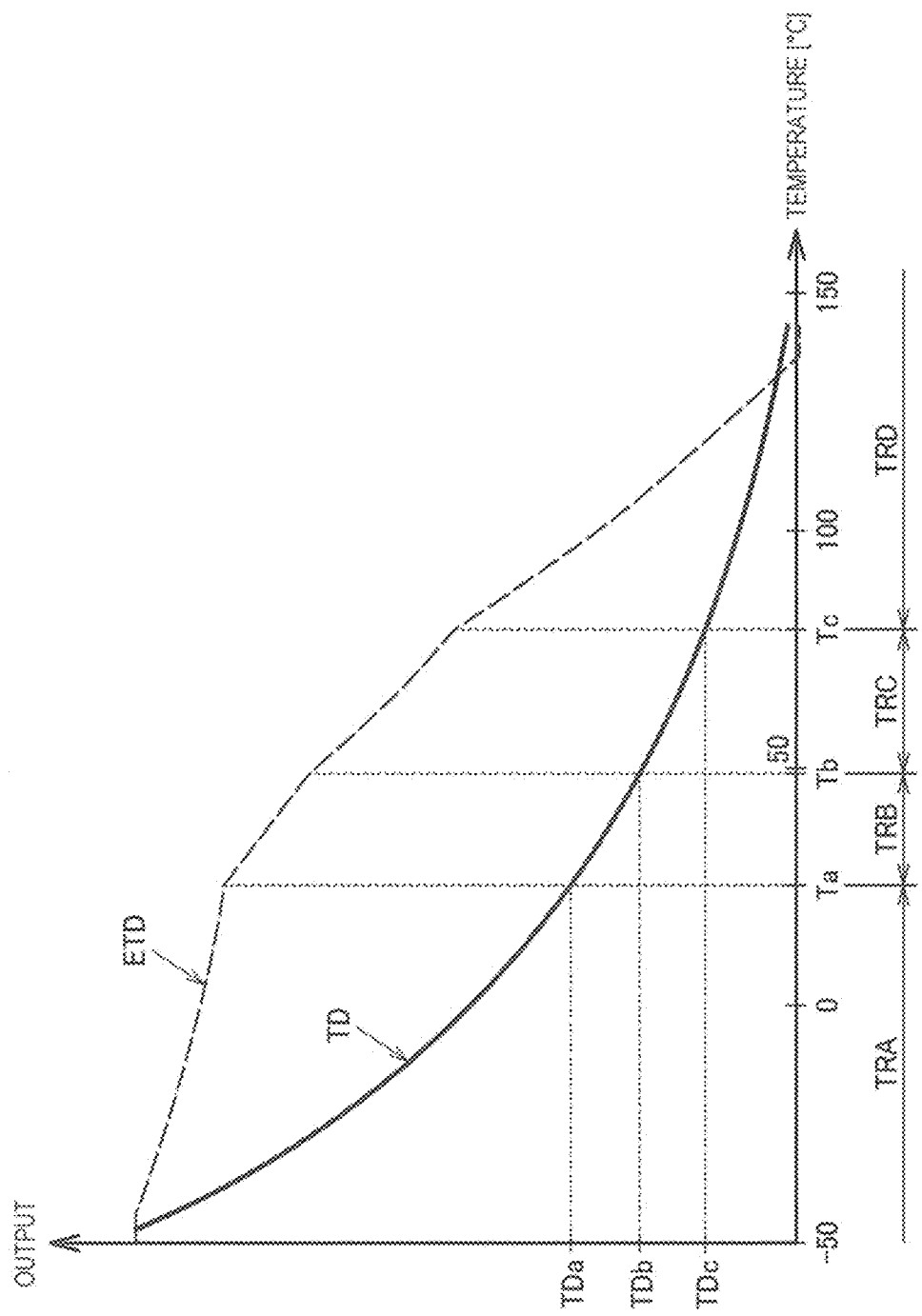
FIG. 8 is an example of conversion executed by a calculation circuit.

FIG. 8 is an example of the conversion executed by the calculation circuit 120. The calculation circuit 120 obtains the temperature detection data ETD by multiplying the output data TD by a coefficient and adding an offset. In FIG. 8, the calculation circuit 120 changes the coefficient to be multiplied to the output data TD with temperatures Ta, Tb, and Tc as boundaries. The coefficient is smaller than 1 in a temperature range TRA lower than Ta, is 1 in a temperature range TRB of Ta or higher and lower than Tb, is larger than 1 in a temperature range TRC of Tb or higher and lower than Tc, and is further larger in a temperature range TRD of Tc or higher. The temperature Ta is set near a room temperature of 25° C., and the slope of the temperature detection data ETD increases in a temperature range higher than the room temperature of 25° C.

Figure 9:
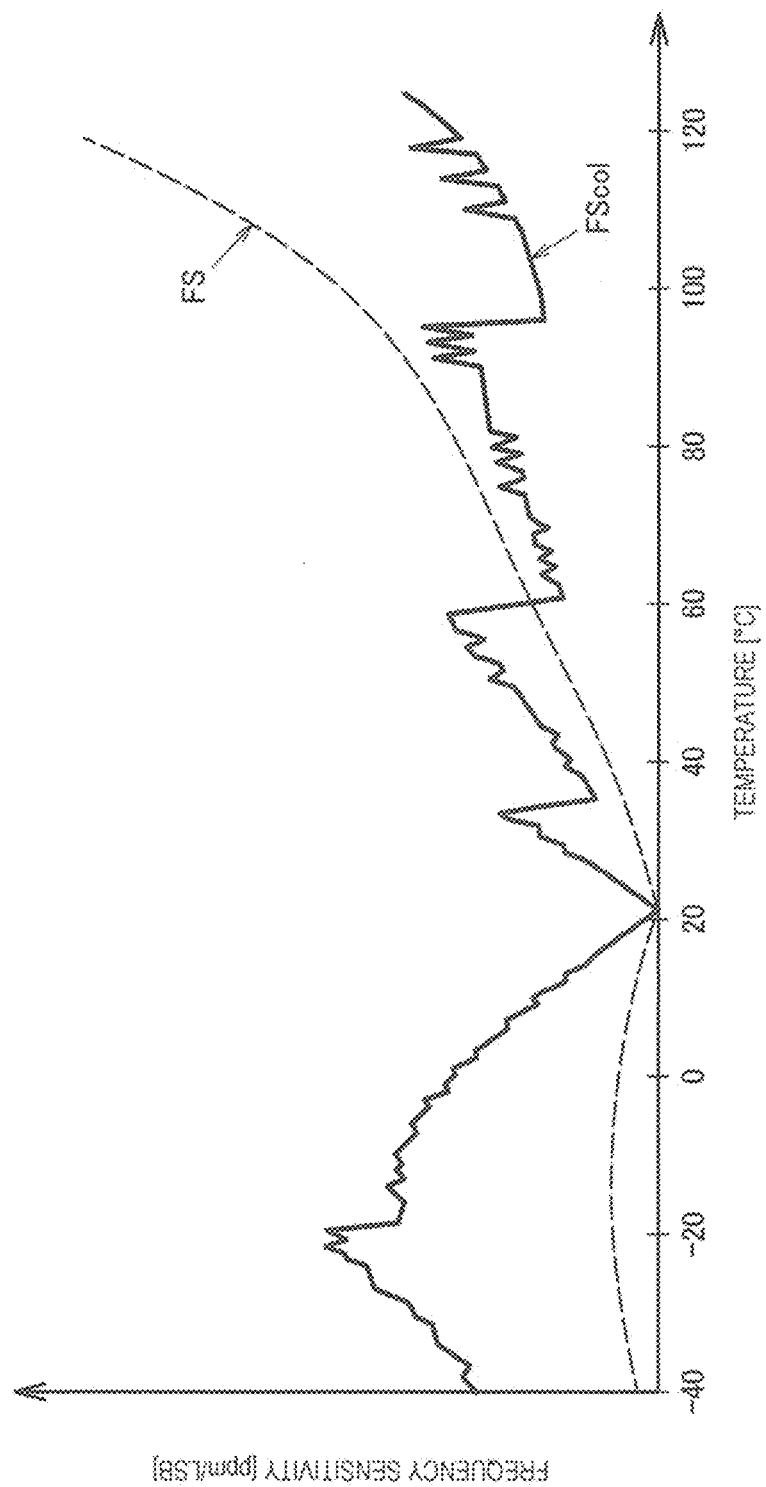
FIG. 9 is an example of frequency sensitivity.

FIG. 9 is an example of the frequency sensitivity. The frequency sensitivity is sensitivity of an oscillation frequency for a temperature change, and in FIG. 9, is indicated by a frequency deviation when the output data TD or the temperature detection data ETD changes by 1 LSB. FS indicates a property of the frequency sensitivity when temperature data is not corrected by the calculation circuit 120, and FScol indicates a property of the frequency sensitivity when the temperature data is corrected by the calculation circuit 120.

When the temperature data is not corrected by the calculation circuit 120, the frequency sensitivity is relatively low near the room temperature or in a temperature range lower than the room temperature. In such a temperature range, since the oscillation frequency is less likely to change even if the temperature changes, a lower temperature adjustment rate is desirable in terms of lower power consumption. On the other hand, in the temperature range higher than the room temperature, as the temperature becomes higher, the frequency sensitivity becomes higher. In such a temperature range, since the oscillation frequency is likely to greatly change when the temperature changes, a higher temperature adjustment rate is desirable in terms of the followability of the temperature compensation.

However, in the output data TD of the temperature sensor circuit 110 shown in FIG. 8, a slope in the temperature range lower than the room temperature is relatively larger than a slope in the temperature range higher than the room temperature. In this way, the output data TD is likely to variate with respect to a temperature change at a low temperature, and the temperature adjustment rate is relatively high at the low temperature.

Therefore, as shown in FIG. 8, the calculation circuit 120 adjusts the temperature sensitivity of the temperature detection data ETD, so that a slope of the temperature detection data ETD in the temperature range higher than the room temperature is relatively larger than the slope thereof in the temperature range lower than the room temperature. Accordingly, the temperature detection data ETD is likely to variate with respect to a temperature change at a high temperature, and the temperature adjustment rate is likely to relatively increase at the high temperature. Accordingly, the temperature adjustment rate is low in the temperature range that is near the room temperature or that is lower than the room temperature, the temperature adjustment rate is high in the temperature range higher than the room temperature, and the followability of the temperature compensation for the frequency variation due to the temperature change is uniform.

In other words, the calculation circuit 120 adjusts the temperature sensitivity of the temperature detection data ETD, so that the frequency sensitivity is uniform. As shown in FIG. 9, the frequency sensitivity FScol when the temperature data is corrected by the calculation circuit 120 is more uniform than the frequency sensitivity FS when the temperature data is not corrected by the calculation circuit 120. When the temperature data is not corrected by the calculation circuit 120, it is required to increase the temperature adjustment rate to ensure the followability of the temperature compensation in a high temperature region where the frequency sensitivity FS is high. In the present embodiment, since the frequency sensitivity FScol in the high temperature region is reduced by the calculation circuit 120 correcting the temperature data, the temperature adjustment rate can be reduced as compared with the case in which the temperature data is not corrected by the calculation circuit 120. Accordingly, the power consumption due to the temperature compensation can be reduced.

In the present embodiment described above, the temperature detection circuit 105 includes the temperature sensor circuit 110 that executes the temperature detection, and the calculation circuit 120 that outputs, based on the output data TD of the temperature sensor circuit 110, the temperature detection data ETD in which the temperature sensitivity is adjusted. The temperature detection rate control circuit 190 controls the temperature detection rate based on the temperature detection data ETD in which the temperature sensitivity is adjusted by the calculation circuit 120.

The temperature detection rate control circuit 190 controls the temperature detection rate based on a variation in the temperature detection data ETD. According to the present embodiment, the calculation circuit 120 adjusts the temperature sensitivity of the temperature detection data ETD, so that a degree of the temperature variation at which the variation of the temperature detection data ETD is determined is adjusted. By adjusting the temperature sensitivity of the temperature detection data ETD according to the frequency sensitivity as described above, the temperature adjustment rate can be increased in a temperature region where the frequency sensitivity is high, and the temperature adjustment rate can be decreased in a temperature region where the frequency sensitivity is low. Accordingly, the accuracy of the oscillation frequency can be improved, and power consumption of the temperature compensation can be reduced.

In the present embodiment, the temperature properties of the oscillation frequency include a first sensitivity in a first temperature range, and a second sensitivity higher than the first sensitivity in a second temperature range lower or higher than the first temperature range. The calculation circuit 120 sets the temperature sensitivity of the temperature detection data ETD as a first temperature sensitivity in the first temperature range and as a second temperature sensitivity higher than the first temperature sensitivity in the second temperature range.

In the example in FIG. 8, when the first temperature range is any one of the temperature ranges TRA, TRB, and TRC, the second temperature range is the temperature range TRD. In addition, the frequency sensitivity FS corresponds to the temperature properties of the oscillation frequency in the example in FIG. 9. As shown in FIGS. 8 and 9, the frequency sensitivity FS in any one of the temperature ranges TRA, TRB, and TRC corresponds to the first sensitivity, and the frequency sensitivity FS in a temperature range TDR corresponds to the second sensitivity higher than the first sensitivity. At this time, as shown in FIG. 8, the temperature sensitivity of the temperature detection data ETD in any one of the temperature ranges TRA, TRB, and TRC corresponds to the first temperature sensitivity, the temperature sensitivity of the temperature detection data ETD in the temperature range TRD corresponds to the second temperature sensitivity, and the second temperature sensitivity is set to be higher than the first temperature sensitivity. FIGS. 8 and 9 show examples in which the second temperature range is higher than the first temperature range, and the second temperature range may be lower than the first temperature range according to the temperature properties of the oscillation frequencies of the resonator and the oscillation circuit.

According to the present embodiment, the temperature adjustment rate can be increased in a second temperature region where the frequency sensitivity is high, and the temperature adjustment rate can be decreased in a first temperature region where the frequency sensitivity is low. Accordingly, the followability of the temperature compensation can be increased and the accuracy of the oscillation frequency can be improved in the second temperature region where the frequency sensitivity is high, and the temperature adjustment rate can be decreased and the power consumption of the temperature compensation can be reduced in the first temperature region where the frequency sensitivity is low.

4. Calculation Circuit

Figure 10:
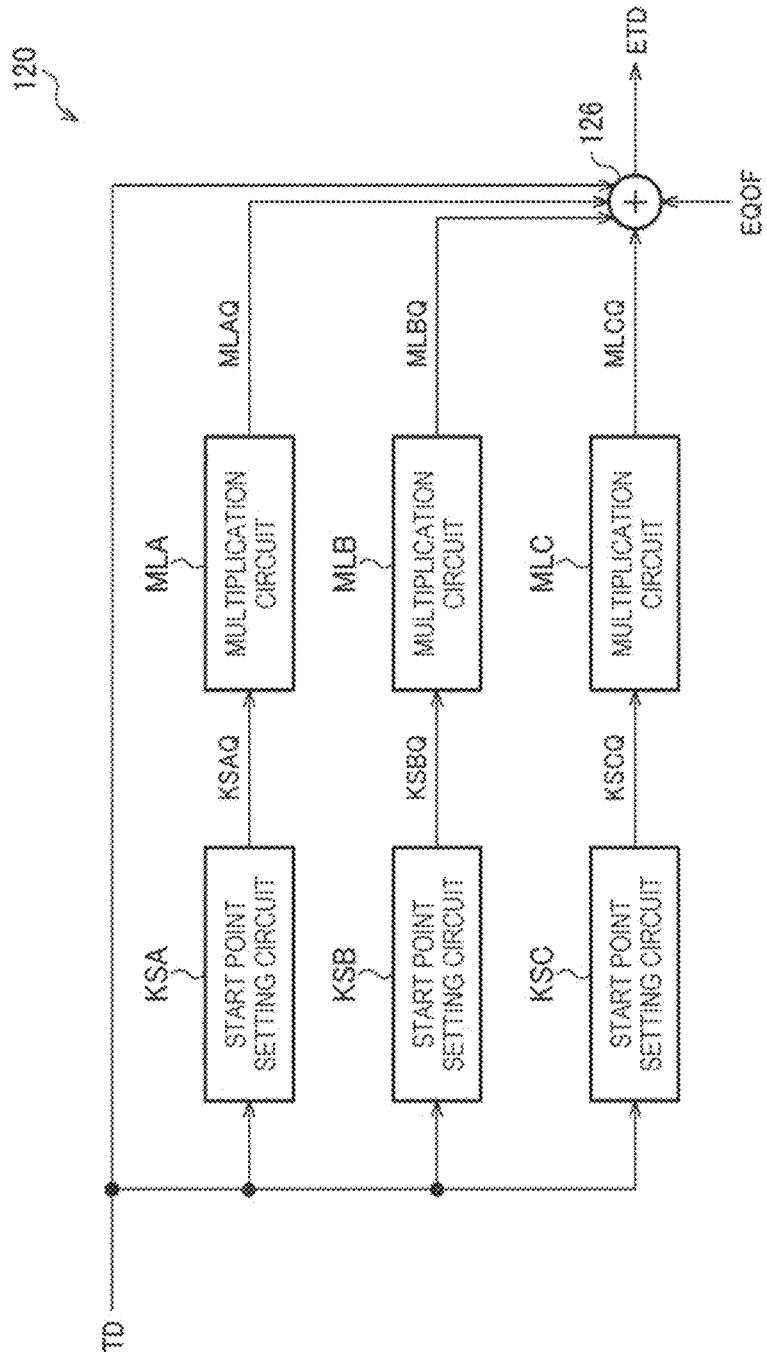
FIG. 10 is a detailed configuration example of the calculation circuit.

FIG. 10 is a detailed configuration example of the calculation circuit 120. The calculation circuit 120 includes start point setting circuits KSA, KSB, and KSC, multiplication circuits MLA, MLB, and MLC, and an addition circuit 126.

The start point setting circuit KSA sets a start temperature Ta of the temperature range TRA in FIG. 8. The start temperature Ta is a boundary between the adjacent temperature ranges TRA and TRB, and is an upper limit of the temperature range TRA. Specifically, the start temperature Ta is set according to the output data TD=TDa of the temperature sensor circuit 110 corresponding to the start temperature Ta. The start point setting circuit KSA outputs differential temperature data KSAQ=TD−TDa when TD≥TDa, and outputs differential temperature data KSAQ=0 when TD<TDa. The multiplication circuit MLA outputs output data MLAQ=−KSAQ×GA=−(TD−TDa)× GA. When TD<TDa, MLAQ=0.

The start point setting circuit KSB sets a start temperature Tb of the temperature range TRC in FIG. 8. The start temperature Tb is a boundary between the adjacent temperature ranges TRB and TRC, and is a lower limit of the temperature range TRC. Specifically, the start temperature Tb is set according to the output data TD=TDb of the temperature sensor circuit 110 corresponding to the start temperature Tb. The start point setting circuit KSB outputs differential temperature data KSBQ=−(TD−TDb) when TD≤TDb, and outputs differential temperature data KSBQ=0 when TD>TDb. The multiplication circuit MLB outputs output data MLBQ=−KSBQ×GB=(TD−TDb)×GB. When TD>TDb, MLBQ=0.

The start point setting circuit KSC sets a start temperature Tc of the temperature range TRD in FIG. 8. The start temperature Tc is a boundary between the adjacent temperature ranges TRC and TRD, and is a lower limit of the temperature range TRD. Specifically, the start temperature Tc is set according to the output data TD=TDc of the temperature sensor circuit 110 corresponding to the start temperature Tc. The start point setting circuit KSC outputs differential temperature data KSCQ=−(TD−TDc) when TD≤TDc, and outputs differential temperature data KSCQ=0 when TD>TDc. The multiplication circuit MLC outputs output data MLCQ=−KSCQ×GC=(TD−TDc)×GC. A gain GC satisfies GC>0. when TD>TDc, MLCQ=0.

The addition circuit 126 adds the output data TD, the output data MLAQ, the output data MLBQ, the output data MLCQ, and an offset value EQOF, and outputs a result of the addition as the temperature detection data ETD.

In the temperature range TRA, ETD=TD−(TD−TDa)×GA+EQOF=(1−GA)×TD+(TDa×GA+EQOF), and the temperature sensitivity of the temperature detection data ETD is lower than the temperature sensitivity of the output data TD of the temperature sensor circuit 110.

In the temperature range TRB, ETD=TD+EQOF, and the temperature sensitivity of the temperature detection data ETD is the same as the temperature sensitivity of the output data TD of the temperature sensor circuit 110.

In the temperature range TRC, ETD=TD+(TD−TDb)×GB+EQOF=(1+GB)×TD+(−TDb×GB+EQOF), and the temperature sensitivity of the temperature detection data ETD is higher than the temperature sensitivity of the output data TD of the temperature sensor circuit 110.

In the temperature range TRD, ETD=TD+(TD−TDb)×GB+(TD−TDc)×GC+EQOF=(1+GB+GC)×TD+(−TDb×GB−TDc×GC+EQOF), and the temperature sensitivity of the temperature detection data ETD is further higher than the temperature sensitivity in the temperature range TRC.

The offset value EQOF is set such that a lower limit of the temperature detection data ETD in an operating temperature range does not become negative. That is, the offset value EQOF is set such that the lower limit of the temperature detection data ETD is 0 or larger than 0.

Figure 11:
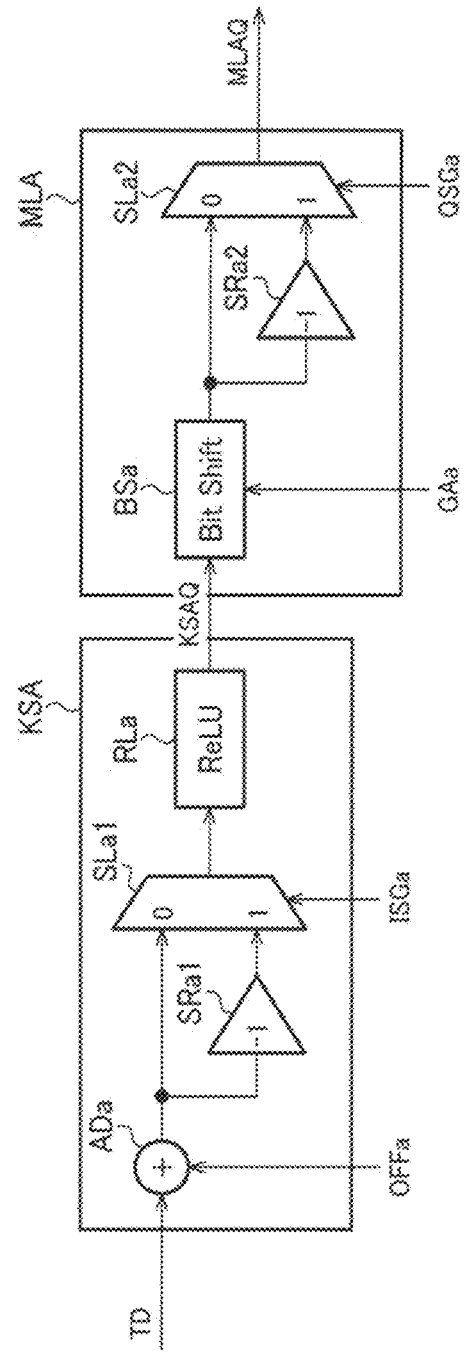
FIG. 11 is a detailed configuration example of a start point setting circuit and a multiplication circuit.

FIG. 11 is a detailed configuration example of the start point setting circuit KSA and the multiplication circuit MLA. Configurations of the start point setting circuits KSB and KSC and the multiplication circuits MLB and MLC are also the same.

The start point setting circuit KSA includes an addition circuit ADa, a sign inversion circuit SRa1, a selector SLa1, and a ReLU circuit RLa. ReLU is an abbreviation for rectified linear unit.

The addition circuit ADa adds an offset OFFa to the output data TD of the temperature sensor circuit 110. The sign inversion circuit SRa1 inverts a sign of output data of the addition circuit ADa. The selector SLa1 selects the output data of the addition circuit ADa when a sign selection signal ISGa is 0, and selects output data of the sign inversion circuit SRa1 when the sign selection signal ISGa is 1. The ReLU circuit RLa outputs 0 when the output data of the selector SLa1 is smaller than 0, and outputs the data as it is when the output data of the selector SLa1 is 0 or larger. The offset OFFa and the sign selection signal ISGa are stored in the register 170.

In the example in FIG. 8, it is set that the offset OFFa=−TDa and the sign selection signal ISGa=0. At this time, the output data of the addition circuit ADa is TD−TDa, the selector SLa1 selects TD−TDa, and the ReLU circuit RLa outputs KSAQ=TD−TDa when TD−TDa≥0, and outputs KSAQ=0 when TD−TDa<0. The start temperature Ta of the temperature range RTA is specified according to the offset OFFa=−TDa, and an absolute value TDa of the offset OFFa is the output data of the temperature sensor circuit 110 corresponding to the start temperature Ta. As described above, an operation of the start point setting circuit KSA described with reference to FIG. 10 is achieved.

The multiplication circuit MLA includes a bit shift circuit BSa, a sign inversion circuit SRa2, and a selector SLa2.

The bit shift circuit BSa bit-shifts the differential temperature data KSAQ from the start point setting circuit KSA to multiply the differential temperature data KSAQ by the gain GA. A shift direction and a shift amount of the bit shift are specified according to a bit shift value GAa. The shift direction is a LSB direction or a MSB direction, and the shift amount is the number of bits to be shifted. The gain GA of the bit shift is 2, 4, 8, . . . in the MSB direction, and is 0.5, 0.25, 0.125, . . . in the LSB direction. In addition, when the shift amount is 0, the gain of the bit shift is GA=1. The sign inversion circuit SRa2 inverts a sign of output data of the bit shift circuit BSa. The selector SLa2 selects the output data of the bit shift circuit BSa when a sign selection signal QSGa is 0, and selects output data of the sign inversion circuit SRa2 when the sign selection signal QSGa is 1. The bit shift value GAa and the sign selection signal QSGa are stored in the register 170.

In the example in FIG. 8, a shift direction of the bit shift value GAa is set in the LSB direction. That is, the gain of the bit shift is GA<1. In addition, it is set that the sign selection signal QSGa=1. At this time, the output data of the bit shift circuit BSa is KSAQ×GA, and the selector SLa2 selects −KSAQ×GA. Accordingly, MLAQ=−(TD−TDa)×GA is output when TD≥TDa, and MLAQ=0 is output when TD<TDa. As described above, an operation of the multiplication circuit MLA described with reference to FIG. 11 is achieved.

Figure 12:
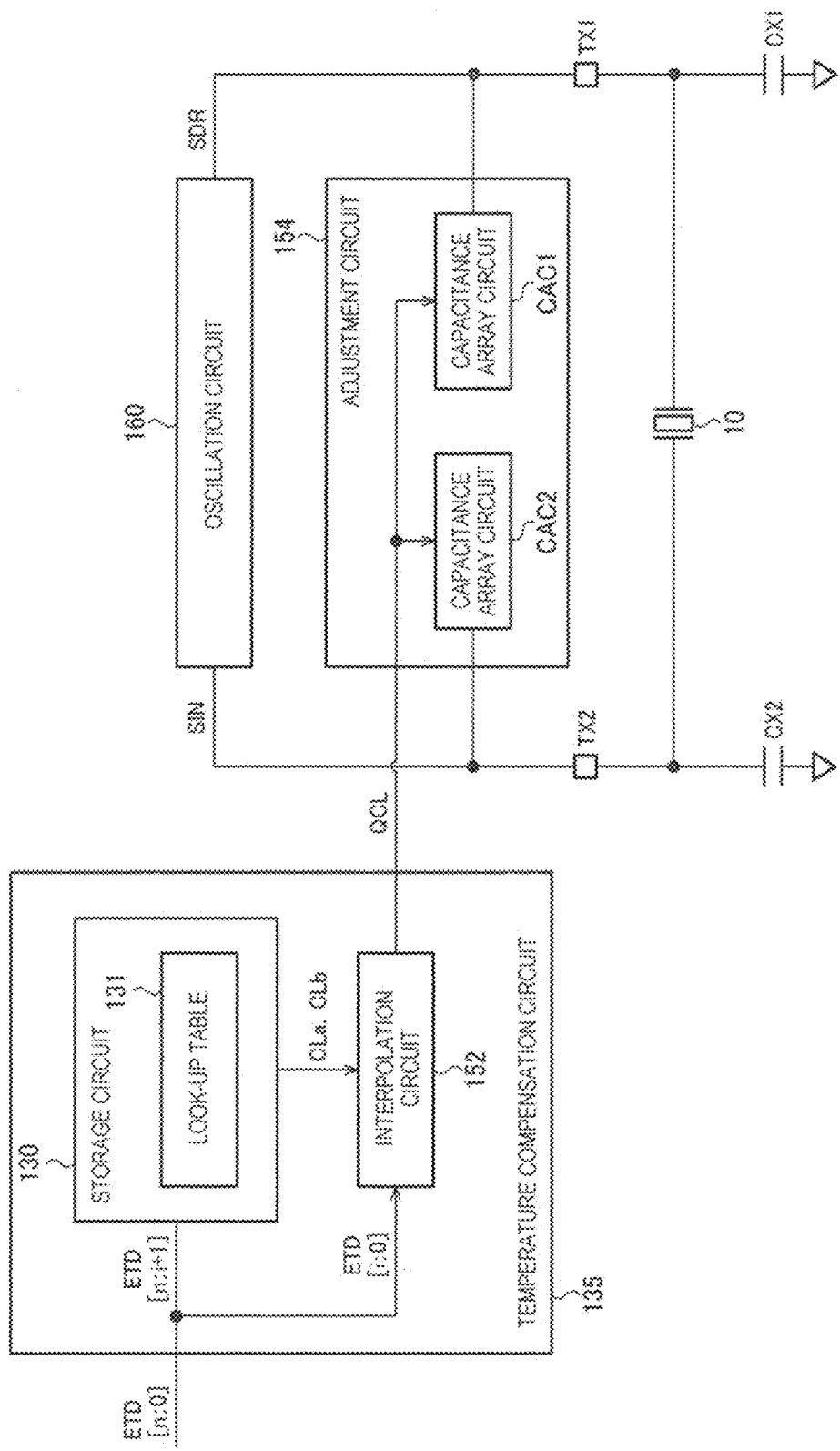
FIG. 12 is a detailed configuration example of the temperature compensation circuit and an adjustment circuit, and a coupling configuration example of a resonator, an oscillation circuit, and the adjustment circuit.

5. Temperature Compensation Circuit, Adjustment Circuit, and Oscillation Circuit FIG. 12 shows a detailed configuration example of the temperature compensation circuit 135 and the adjustment circuit 154, and a coupling configuration example of the resonator 10, the oscillation circuit 160, and the adjustment circuit 154. Hereinafter, it is assumed that n is an integer of 1 or more and the temperature detection data ETD is n+1 bit data ETD [n:0].

First, the detailed configuration example of the temperature compensation circuit 135 will be described. The temperature compensation circuit 135 includes a storage circuit 130 and an interpolation circuit 152.

The storage circuit 130 stores a look-up table 131 indicating correspondence between the temperature detection data ETD [n:0] and frequency adjustment data. Specifically, an upper bit ETD [n:i+1] of the temperature detection data ETD [n:0] is input to the storage circuit 130 as an address of the look-up table 131. i is an integer of 1 or more and n or less. The look-up table 131 stores the frequency adjustment data at each address, and the storage circuit 130 outputs frequency adjustment data CLa at the address specified according to the upper bit ETD [n:i+1] and frequency adjustment data CLb at an adjacent address. The storage circuit 130 is, for example, a semiconductor memory such as a nonvolatile memory or a RAM, or a register including a latch circuit or the like. The nonvolatile memory is, for example, an OTP memory such as a FAMOS memory, and is not limited thereto. Alternatively, the nonvolatile memory may be an EEPROM such as a MONOS memory, or a fuse ROM, or the like. FAMOS is an abbreviation for floating gate avalanche injection metal oxide semiconductor. MONOS is an abbreviation for metal-oxide-nitride-oxide-silicon.

The interpolation circuit 152 outputs the adjustment data QCL by interpolating between the frequency adjustment data CLa and the frequency adjustment data CLb based on a lower bit ETD [i:0] of the temperature detection data ETD [n:0].

The frequency adjustment data stored in the look-up table 131 is data for reducing a temperature dependence of the oscillation frequencies of the oscillator circuit 160 and the resonator 10, and the oscillation frequencies become constant regardless of the temperature by adjusting the oscillation frequencies using the frequency adjustment data.

Next, the coupling configuration example of the resonator 10, the oscillation circuit 160, and the adjustment circuit 154 will be described.

One end of the resonator 10 is coupled to a terminal TX1, and the other end of the resonator 10 is coupled to a terminal TX2. The terminals TX1 and TX2 are terminals of the circuit device 100, and are, for example, pads that are provided at a semiconductor substrate. One end of a capacitor CX1 is coupled to the terminal TX1, and the other end of the capacitor CX1 is coupled to a ground node. One end of a capacitor CX2 is coupled to the terminal TX2, and the other end of the capacitor CX2 is coupled to the ground node. The capacitors CX1 and CX2 are provided, for example, as external components of the circuit device 100.

The resonator 10, the oscillation circuit 160, and the capacitors CX1 and CX2 constitute a so-called colpitts type oscillation circuit. The oscillation circuit 160 generates a drive signal SDR by inverting and amplifying a signal SIN received from the other end of the resonator 10 via the terminal TX2, and outputs the drive signal SDR to the one end of the resonator 10 via the terminal TX1. The oscillation circuit 160 is, for example, an inverter, and an input node of the inverter is coupled to the terminal TX2, and an output node of the inverter is coupled to the terminal TX1. However, the oscillation circuit 160 is not limited thereto, and may be various amplifier circuits such as an amplifier circuit using a bipolar transistor. The oscillation signal is, for example, the drive signal SDR. The drive signal SDR may be output as the clock signal CLK in FIG. 1, and the circuit device 100 may include an output circuit that outputs the clock signal CLK by buffering or dividing the drive signal SDR.

Next, the detailed configuration example of the adjustment circuit 154 will be described. The adjustment circuit 154 includes capacitance array circuits CAC1 and CAC2.

The capacitance array circuit CAC1 is coupled to the terminal TX1, and the capacitance array circuit CAC2 is coupled to the terminal TX2. Hereafter, a configuration is described using the capacitance array circuit CAC1 as an example, and the capacitance array circuit CAC2 also has the same configuration.

The capacitance array circuit CAC1 includes first to m-th capacitors and first to m-th switches. m is an integer of two or more. The j-th capacitor and the j-th switch are coupled in series between the terminal TX1 and the ground node. j=1, 2, . . . , and m. The first to m-th switches are controlled to be turned on or off according to the adjustment data QCL from the interpolation circuit 152. Accordingly, a capacitance value of the capacitance array circuit CAC1 is controlled according to the adjustment data QCL, and the oscillation frequency is adjusted.

A circuit device according to the present embodiment described above includes an oscillation circuit that generates an oscillation signal using a resonator, a temperature detection circuit that outputs temperature detection data, a temperature compensation circuit, and a temperature detection rate control circuit. The temperature compensation circuit performs temperature compensation on an oscillation frequency of the oscillation signal based on the temperature detection data. The temperature detection rate control circuit controls a temperature detection rate at which the temperature detection circuit executes temperature detection. The temperature detection rate control circuit controls the temperature detection rate based on a variation in the temperature detection data.

According to the present embodiment, when an environmental temperature changes, the temperature detection rate is controlled based on the variation in the temperature detection data. Accordingly, it is possible to cause the temperature compensation to follow the temperature variation caused by various factors and at various timings, and a highly accurate oscillation frequency is maintained. In addition, since the temperature detection rate can be decreased when there is no or small temperature variation, both high accuracy of the oscillation frequency and low power consumption of the circuit can be achieved.

In the present embodiment, the temperature detection circuit may include a temperature sensor circuit that executes the temperature detection, and a calculation circuit that outputs, based on output data of the temperature sensor circuit, temperature detection data in which the temperature sensitivity is adjusted. The temperature detection rate control circuit may control the temperature detection rate based on the temperature detection data in which the temperature sensitivity is adjusted by the calculation circuit.

The temperature detection rate control circuit controls the temperature detection rate based on a variation in the temperature detection data. According to the present embodiment, the calculation circuit adjusts the temperature sensitivity of the temperature detection data, so that a degree of the temperature variation at which the variation of the temperature detection data is determined is adjusted. By adjusting the temperature sensitivity of the temperature detection data according to the frequency sensitivity, the temperature adjustment rate can be increased in a temperature region where the frequency sensitivity is high, and the temperature adjustment rate can be decreased in a temperature region where the frequency sensitivity is low. Accordingly, the accuracy of the oscillation frequency can be improved, and power consumption of the temperature compensation can be reduced.

In the present embodiment, temperature properties of the oscillation frequency may include a first sensitivity in a first temperature range, and a second sensitivity higher than the first sensitivity in a second temperature range lower or higher than the first temperature range. The calculation circuit may set the temperature sensitivity of the temperature detection data as a first temperature sensitivity in the first temperature range and as a second temperature sensitivity higher than the first temperature sensitivity in the second temperature range.

According to the present embodiment, the temperature adjustment rate can be increased in a second temperature region where the frequency sensitivity is high, and the temperature adjustment rate can be decreased in a first temperature region where the frequency sensitivity is low. Accordingly, the followability of the temperature compensation can be increased and the accuracy of the oscillation frequency can be improved in the second temperature region where the frequency sensitivity is high, and the temperature adjustment rate can be decreased and the power consumption of the temperature compensation can be reduced in the first temperature region where the frequency sensitivity is low.

In the present embodiment, the temperature detection circuit may execute an intermittent operation of executing temperature detection in an intermittent temperature detection period. The temperature detection rate control circuit may control the temperature detection rate by controlling a rate of the intermittent operation.

According to the present embodiment, the temperature compensation is intermittently performed by detecting a temperature by the intermittent operation. Accordingly, the power consumption of the temperature compensation is reduced. Further, both high accuracy of an oscillation frequency and low power consumption of a circuit can be achieved by adaptively controlling the rate of the intermittent operation according to the variation in the temperature detection data.

In the present embodiment, the temperature detection rate control circuit may set the temperature detection rate to a n-th rate that is the highest in a first rate to the n-th rate when the variation in the temperature detection data is a first threshold value or more. n is an integer of two or more.

According to the present embodiment, when there is a temperature variation in which the variation in the temperature detection data is the first threshold value or more, that is, when it is determined that a rapid temperature variation occurs, the temperature detection rate is set to the maximum n-th rate. Accordingly, the temperature compensation follows a variation in an oscillation frequency due to the rapid temperature variation, and a highly accurate oscillation signal with a reduced frequency deviation is obtained.

In the present embodiment, the temperature detection rate control circuit may decrease the temperature detection rate from the k-th rate to the (k−1)-th rate in the first rate to the n-th rate when the variation in the temperature detection data is the second threshold value or less. The second threshold value is smaller than the first threshold value. k is an integer of two or more and n or less.

According to the present embodiment, when it is determined that a temperature variation occurring between a previous temperature compensation and a current temperature compensation at a current temperature adjustment rate is small, that is, the temperature adjustment rate is too high with respect to the temperature variation, the temperature detection rate decreases by one stage. Accordingly, the temperature adjustment rate can be set to be as low as possible in a range in which the temperature compensation can follow the variation in the oscillation frequency due to the temperature variation.

In the present embodiment, an initial value of the temperature detection rate may be the n-th rate.

Since the variation in the temperature detection data is unknown in an initial state, a followability of the temperature compensation can be ensured from a start of temperature adjustment by setting the n-th rate as the initial value. In addition, when the variation in the temperature detection data is small, the temperature adjustment rate adaptively decreases as described above.

In the present embodiment, the temperature detection rate control circuit may control the temperature detection rate based on a difference between the previous temperature detection data and the current temperature detection data.

The difference between the previous temperature detection data and the current temperature detection data indicates the temperature variation occurring between the previous temperature compensation and the current temperature compensation, and relates to the frequency deviation of the oscillation frequency occurring between the previous temperature compensation and the current temperature compensation. By controlling the temperature adjustment rate according to the difference between the previous temperature detection data and the current temperature detection data, the temperature adjustment rate is controlled such that the frequency deviation of the oscillation frequency occurring between the previous temperature compensation and the current temperature compensation is in an appropriate range.

In the present embodiment, the temperature compensation circuit may perform the temperature compensation at the temperature detection rate.

According to the present embodiment, the temperature adjustment rate that is a rate of the temperature compensation can be controlled by the temperature detection rate control circuit controlling the temperature detection rate. Accordingly, since an overall rate of the temperature compensation from a time point when the temperature detection circuit detects a temperature to a time point when the adjustment circuit adjusts the oscillation frequency is controlled, power consumption of an entire circuit relating to the temperature compensation decreases when the temperature detection rate is reduced.

An oscillator according to the present embodiment includes a resonator and a circuit device. The circuit device includes an oscillation circuit that generates an oscillation signal using a resonator, a temperature detection circuit that outputs temperature detection data, a temperature compensation circuit, and a temperature detection rate control circuit. The temperature compensation circuit performs temperature compensation of an oscillation frequency of the oscillation signal based on the temperature detection data. The temperature detection rate control circuit controls a temperature detection rate at which the temperature detection circuit executes temperature detection. The temperature detection rate control circuit controls the temperature detection rate based on a variation in the temperature detection data.

In the present embodiment, the temperature detection circuit may include a temperature sensor circuit that executes the temperature detection, and a calculation circuit that outputs, based on output data of the temperature sensor circuit, temperature detection data in which the temperature sensitivity is adjusted. The temperature detection rate control circuit may control the temperature detection rate based on the temperature detection data in which the temperature sensitivity is adjusted by the calculation circuit.

In the present embodiment, temperature properties of the oscillation frequency may include a first sensitivity in a first temperature range, and a second sensitivity higher than the first sensitivity in a second temperature range lower or higher than the first temperature range. The calculation circuit may set the temperature sensitivity of the temperature detection data as a first temperature sensitivity in the first temperature range and as a second temperature sensitivity higher than the first temperature sensitivity in the second temperature range.

Although the present embodiment has been described in detail as described above, it will be readily apparent to those skilled in the art that multiple modifications may be made without departing substantially from novel matters and effects according to the present disclosure. Therefore, all such modifications are intended to be included within the scope of the present disclosure. For example, a term cited with a different term having a broader meaning or the same meaning at least once in the specification or in the drawings can be replaced with the different term in any place in the specification or in the drawings. In addition, all combinations of the present embodiment and the modifications are also included in the scope of the present disclosure. Further, the configurations and operations of the circuit device, the resonator, and the oscillator are not limited to those described in the present embodiment, and various modifications can be made.

What is claimed is:

1. A circuit device comprising:
   an oscillation circuit configured to generate an oscillation signal using a resonator;
   a temperature detection circuit configured to output temperature detection data;
   a temperature compensation circuit configured to perform temperature compensation on an oscillation frequency of the oscillation signal based on the temperature detection data; and
   a temperature detection rate control circuit configured to control a temperature detection rate at which the temperature detection circuit executes temperature detection, wherein
   the temperature detection rate control circuit controls the temperature detection rate based on a variation in the temperature detection data.

2. The circuit device according to claim 1, wherein
   the temperature detection circuit includes:
      a temperature sensor circuit configured to execute the temperature detection; and
      a calculation circuit configured to output, based on output data of the temperature sensor circuit, the temperature detection data in which a temperature sensitivity is adjusted, wherein
   the temperature detection rate control circuit controls the temperature detection rate based on the temperature detection data in which the temperature sensitivity is adjusted by the calculation circuit.

3. The circuit device according to claim 2, wherein
   temperature properties of the oscillation frequency include a first sensitivity in a first temperature range, and a second sensitivity higher than the first sensitivity in a second temperature range lower or higher than the first temperature range, and
   the calculation circuit sets the temperature sensitivity of the temperature detection data as a first temperature sensitivity in the first temperature range and as a second temperature sensitivity higher than the first temperature sensitivity in the second temperature range.

4. The circuit device according to claim 1, wherein
   the temperature detection circuit executes an intermittent operation of executing the temperature detection in an intermittent temperature detection period, and
   the temperature detection rate control circuit controls the temperature detection rate by controlling a rate of the intermittent operation.

5. The circuit device according to claim 1, wherein
   the temperature detection rate control circuit sets the temperature detection rate to a n-th rate that is the highest among a first rate to the n-th rate when the variation in the temperature detection data is a first threshold value or more, n being an integer of two or more.

6. The circuit device according to claim 5, wherein
   the temperature detection rate control circuit decreases the temperature detection rate from the k-th rate to the (k−1)-th rate among the first rate to the n-th rate when the variation in the temperature detection data is equal to or smaller than a second threshold value smaller than the first threshold value, k being an integer of two or more and n or less.

7. The circuit device according to claim 5, wherein
   an initial value of the temperature detection rate is the n-th rate.

8. The circuit device according to claim 1, wherein
   the temperature detection rate control circuit controls the temperature detection rate based on a difference between the previous temperature detection data and the current temperature detection data.

9. The circuit device according to claim 1, wherein
   the temperature compensation circuit performs the temperature compensation at the temperature detection rate.

10. An oscillator comprising:
    a resonator; and
    a circuit device, wherein
    the circuit device includes:
       an oscillation circuit configured to generate an oscillation signal using the resonator;
       a temperature detection circuit configured to output temperature detection data;
       a temperature compensation circuit configured to perform temperature compensation on an oscillation frequency of the oscillation signal based on the temperature detection data; and
       a temperature detection rate control circuit configured to control a temperature detection rate at which the temperature detection circuit executes temperature detection, and
    the temperature detection rate control circuit controls the temperature detection rate based on a variation in the temperature detection data.

11. The oscillator according to claim 10, wherein
    the temperature detection circuit includes:
       a temperature sensor circuit configured to execute the temperature detection; and
       a calculation circuit configured to output, based on output data of the temperature sensor circuit, the temperature detection data in which a temperature sensitivity is adjusted, and
    the temperature detection rate control circuit controls the temperature detection rate based on the temperature detection data in which the temperature sensitivity is adjusted by the calculation circuit.

12. The oscillator according to claim 11, wherein
    temperature properties of the oscillation frequency include a first sensitivity in a first temperature range, and a second sensitivity higher than the first sensitivity in a second temperature range lower or higher than the first temperature range, and the calculation circuit sets the temperature sensitivity of the temperature detection data as a first temperature sensitivity in the first temperature range and as a second temperature sensitivity higher than the first temperature sensitivity in the second temperature range.

* * * * *